United States Patent
Ishibashi et al.

(10) Patent No.: US 9,276,158 B2
(45) Date of Patent: Mar. 1, 2016

(54) PHOTODIODE

(71) Applicant: NTT ELECTRONICS CORPORATION, Yokohama-shi, Kanagawa (JP)

(72) Inventors: Tadao Ishibashi, Yokohama (JP); Hiroki Itoh, Yokohama (JP); Makoto Shimizu, Yokohama (JP)

(73) Assignee: NTT Electronics Corporation, Kanagawa (JP)

( * ) Notice: Subject to any disclaimer, the term of this patent is extended or adjusted under 35 U.S.C. 154(b) by 0 days.

(21) Appl. No.: 14/438,859

(22) PCT Filed: Oct. 4, 2013

(86) PCT No.: PCT/JP2013/005937
§ 371 (c)(1),
(2) Date: Apr. 27, 2015

(87) PCT Pub. No.: WO2014/068850
PCT Pub. Date: May 8, 2014

(65) Prior Publication Data
US 2015/0287869 A1 Oct. 8, 2015

(30) Foreign Application Priority Data
Oct. 31, 2012 (JP) .................. 2012-240480

(51) Int. Cl.
*H01L 31/00* (2006.01)
*H01L 31/105* (2006.01)
(Continued)

(52) U.S. Cl.
CPC .......... *H01L 31/105* (2013.01); *H01L 31/0224* (2013.01); *H01L 31/02164* (2013.01); *H01L 31/03046* (2013.01); *Y02E 10/544* (2013.01)

(58) Field of Classification Search
CPC .................... H01L 31/105; H01L 31/0224
See application file for complete search history.

(56) References Cited

U.S. PATENT DOCUMENTS 5,818,096 A * 10/1998 Ishibashi et al. ............... 257/458
6,740,908 B1 * 5/2004 Giboney ........................ 257/185
(Continued)

FOREIGN PATENT DOCUMENTS

JP 2000-124493 4/2000
JP 2003-174184 6/2003
(Continued)

OTHER PUBLICATIONS

International Preliminary Report on Patentability and Written Opinion in corresponding Application No. PCT/JP/2013/005937 dated May 14, 2015.
(Continued)

*Primary Examiner* — Ngan Ngo
(74) *Attorney, Agent, or Firm* — Workman Nydegger

(57) ABSTRACT

A photodiode that can provide a THz operation with a stable output. A photodiode having a pin-type semiconductor structure includes a semiconductor layer structure and n and p electrodes. The semiconductor layer structure is obtained by sequentially layering an n-type contact layer, a low concentration layer, and a p-type contact layer. The low concentration layer is obtained by layering an electron drift layer, a light absorption layer, and a hole drift layer while being abutted to the n-type contact layer. The n electrode and the p electrode are connected to the n-type contact layer and the p-type contact layer, respectively. During operation, the low concentration layer is depleted.

8 Claims, 11 Drawing Sheets

(51) Int. Cl.
*H01L 31/0224* (2006.01)
*H01L 31/0304* (2006.01)
*H01L 31/0216* (2014.01)

(56) References Cited

U.S. PATENT DOCUMENTS

2005/0001239 A1 1/2005 Ishibashi et al.
2012/0264261 A1* 10/2012 Zhu et al. .................. 438/197

FOREIGN PATENT DOCUMENTS

JP 2004-047674 2/2004
JP 2006-229156 8/2006

OTHER PUBLICATIONS

International Preliminary Report on Patentability in corresponding Application No. PCT/JP/2013/005937 dated May 14, 2015.
International Search Report in corresponding Application No. PCT/JP2013/005937 dated Nov. 5, 2013.
Ito, Hiroshi et al.; "Photonic Generation of Continuous THz Wave Using Uni-Traveling-Carrier Photodiode;" Journal of Lightwave Technology; vol. 23, No. 12, Dec. 2005; pp. 4016-4021.
Effenberger, Frank et al; "Ultrafast, Dual-Depletion Region, InGaAs/InP p-i-n Detector;" Journal of Lightwave Technology; vol. 14, No. 8, Aug. 1996; pp. 1856-1864.

* cited by examiner

PHOTODIODE

TECHNICAL FIELD

The present invention relates to photodiode manufactured by semiconductor for the purpose of the operation in super frequency, in a terahertz band in particular.

BACKGROUND ART

As a method of generating terahertz band (0.3~3 THz) radiation light based on an optical technique, a device has been conventionally used that mainly uses optical nonlinear material or optical electricity-conducting material. Optical electricity-conducting material and photodiode are both one type of a light-receiving device. Recently, attention has been paid on a photomixing method using photodiode (the conversion of optical beat to an electric signal) because of the high efficiency. With regard to a case using photodiode operating at a communication waveband (wavelength of 1.5 gm), the antenna radiation of a few μW level at 1 THz has been already reported and has been considered as a promising technique. The use of a high-performance photodiode operating at a THz band provides a remarkably-improved spectroscopic performance than in the case where a conventional light-receiving device is used. As a result, an application has been expected for example in which a substance-specific absorption spectrum called as a fingerprint spectrum is observed so that a lot of substances (e.g., medical agents) can be determined.

However, the conventional photodiode structure developed for the purpose of application for an optical communication or a measurement instrument device (having a bandwidth up to 100 GHz at the maximum) is manufactured so as to have a response characteristic having a wide bandwidth suitable for digital application. Thus, the conventional photodiode is not always suitable for the THz band operation. The reason is that, while a typical conventional photodiode has an operation frequency range of about 3 dB bandwidth, in a THz application a wide frequency band including a frequency range much higher than a 3 dB bandwidth is typically used.

The photodiode true response is obtained by a delay id caused by the transit time of electrons or the transit time of both of electrons and holes among carriers (electrons and holes) generated in a light absorption layer. Generally, id can be reduced by reducing the thickness of a depletion layer. This reduction of the thickness of the depletion layer is still one factor required for a higher speed of transit. However, since the reduction of the thickness of the depletion layer requires an increase of the junction capacitance, the photodiode junction size or operation current must be adjusted for optimization. No detailed result has been reported with regard to the photodiode operation focusing on the THz operation as described above.

Furthermore, in the case of a communication photodiode, not only a bandwidth but also a light-receiving sensitivity are considered important. On the other hand, there is a difference in requirement such as that the maximum output is regarded as an important in a THz application. Thus, requirements are different. Although in the THz application, a light-receiving sensitivity having a fixed level or more must be secured, its importance is low. Generally, the operation current is maximized in order to increase the THz output, thus causing a disadvantage of the self heating of the photodiode. Under such conditions, how much THz output can be taken out with regard to fixed operation current is most important than the light-receiving sensitivity. No specific report has been found with regard to the design of a THz photodiode from the viewpoint as described above.

CONVENTIONAL EXAMPLE 1

For example, Non-patent Publication 1 reports the THz output characteristic of a "photodiode module" manufactured using a Uni-Traveling-Carrier Photodiode (UTC-PD) and a semiconductor chip obtained by integrating a log periodic antenna on an InP substrate. The THz output declines with a frequency and, when about 300 GHz is exceeded, the tendency of the decline becomes rapid. It is considered that the characteristics of the photodiode modules as described above include a frequency dependency composed of a superimposed combination of a response decline due to the true bandwidth and a response decline due to the junction capacitance of the photodiode. This will be described briefly in the following section.

In the most simplified form, the photodiode true response $R1(\omega)$ is represented by the following formula using the delay id due to the carrier transit time when assuming that the light modulation frequency (=optical beat frequency) is $f(2\pi f=\omega)$.

$$R1(\omega)=1/[1+j\omega\tau d]$$

The response $R2(\omega)$ related to a RC constant, which is determined by the photodiode junction capacitance Cj and the pure resistance antenna load RL, is approximated by the following formula.

$$R2(\omega)=1/[1+j\omega CjRL]$$

Thus, the frequency characteristic of the THz output is represented by the following formula.

$$Pout(\omega)=1/[|R1(\omega)|\times|R2(\omega)|]^2 \propto 1/\omega^4 \quad \text{(high-frequency area: } \omega \gg 1/\tau d \text{ and } \omega \gg 1/Cj\times RL\text{)}$$

The measurement value of the THz output observed in Non-patent Publication 1 also shows a tendency of $\propto 1/\omega^4$ in a range exceeding about 400 GHz. Specifically, it is considered that the true response of the photodiode used in Non-patent Publication 1 is not special and has a substantially typical frequency characteristic.

CONVENTIONAL EXAMPLE 2

Effenberser et al. suggest a partial absorption layer-type pin photodiode (see Non-patent Publication 2). FIG. 7 illustrates the band diagram. This photodiode is configured so that an n-type contact layer 71 has thereon a layered structure of an electron drift layer 72, a light absorption layer 73, a p-type contact buffer layer 74, and a p-type contact layer 75 and the p-type contact layer 75 has thereon a p electrode 76. The electron drift layer 72(=depletion layer) having a certain thickness and having no light absorption is inserted to the n contact layer 71 having the pin-type structure. Among carriers generated by light absorption, holes directly flows to the p-type contact buffer layer 74. On the other hand, electrons passes the electron drift layer 72 to subsequently reach the n-type contact layer 71.

The electron speed higher than the hole speed prevents, even when the electron travels for a relatively-long distance, the entire current response from being deteriorated. Specifically, the 3 dB bandwidth determined by the carrier transit time is prevented from declining when the thickness of the electron drift layer has a certain value or less. As a result, the junction capacitance can be reduced without deteriorating the bandwidth, and entire response characteristic of the photodiode including an RC constant will be improved.

However, what is discussed is a photodiode structure having the 3 dB bandwidth of only about 30-40 GHz. No guideline for THz application is disclosed. The following section will describe, based on a simple model, a case where a "partial absorption layer-type" pin-type photodiode structure suggested in Non-patent Publication 2 is scaled from the viewpoint of a THz application.

The light absorption layer of InGaAs is used. While the thickness of the entire depletion layer including the light absorption layer 73 (layer thickness of Wa) and the electron drift layer 72 is being maintained at 0.23 µm, the light absorption layer thickness Wa is changed within a range of 600 A to 2200 A. The current response (i.e., the above-described frequency response due to the transit time of both of electrons and holes) is calculated based on an assumption that the electron travel speed is $6 \times 10^7$ cm/s in a speed overshoot status (in contrast with the case of Non-patent Publication 2) and the travel speed has a normal value of $0.45 \times 10$ cm/s.

FIG. 8 shows the simulation result of the THz response. In the case of the Wa=2200 A structure close to a conventional pin-type structure having a thick InGaAs light absorption layer, it is understood that the frequency response [R22(f) in FIG. 8] is composed of a hole response component declining at about 100 GHz and an electronic response component increasing to a frequency of 100 GHz or more. When Wa=2200 A, the 3 dB bandwidth is undesirably governed by the hole current response. Reduce of Wa as from 1400 A to 600 A cause the response [R14(f) and R06(f)] increases to the high frequency side. When Wa=600 A, the 3 dB bandwidth increases to 1.1 THz. Due to such an increase of the 3 dB bandwidth, when an asymmetric structure is provided in which the light absorption layer in the depletion layer is provided to the p contact side, the contribution of the induction current components of the electrons increases relative to the contribution of the induction current components of the holes, thus resulting in the entire response governed by the electron response.

On the other hand, with regard to the responses on a operation in the region of 1 THz or more in all of the structures compared here, a 10 dB reduction bandwidth (f10 dB) exists in the vicinity of 2 THz and thus no significant difference is found. A response on a operation near 3 THz rapidly decreases to a value of about 1/50 or less when compared with a low-frequency area. In the case of the Wa=600 A structure having a superior 3 dB bandwidth, a tendency of a response decrease on a operation in from 2 THz to 3 THz is more remarkable.

CITATION LIST

Non Patent Literature

NPL1: Hiroshi Ito et al., J. Lightwave Tech. Vol. 23, No. 12, pp. 4016-4021, 2005
NPL2: F. J. Effenberger and A. M. Joshi, J. Lightwave Tech. Vol. 14, No. 8, pp. 1859-1846, 1996

SUMMARY OF INVENTION

Technical Problem

As described above, the operation in THz of the photodiode has been already reported. A tendency in a reverse proportion to approximately the fourth power of the frequency has been experimentally observed. However, it has been not yet clarified what a kind of photodiode structure should be selected in order to improve a THz frequency range much higher than f3 dB output characteristic.

It is an objective of the present invention to provide a photodiode that can provide a THz operation with a stable output (i.e., a photodiode that can provide a high output to fixed operation current).

Solution to Problem

In order to solve the above disadvantage, the invention according to one embodiment is a photodiode having a pin-type semiconductor structure including a semiconductor layer structure obtained by sequentially layering an n-type contact layer, a low concentration layer, and a p-type contact layer and an n electrode and a p electrode connected to the n-type contact layer and the p-type contact layer, respectively. During the operation, the low concentration layer is depleted. The low concentration layer is obtained by layering an electron drift layer, a light absorption layer, and a hole drift layer while being abutted to the n-type contact layer.

DESCRIPTION OF EMBODIMENTS

Figure 1A:
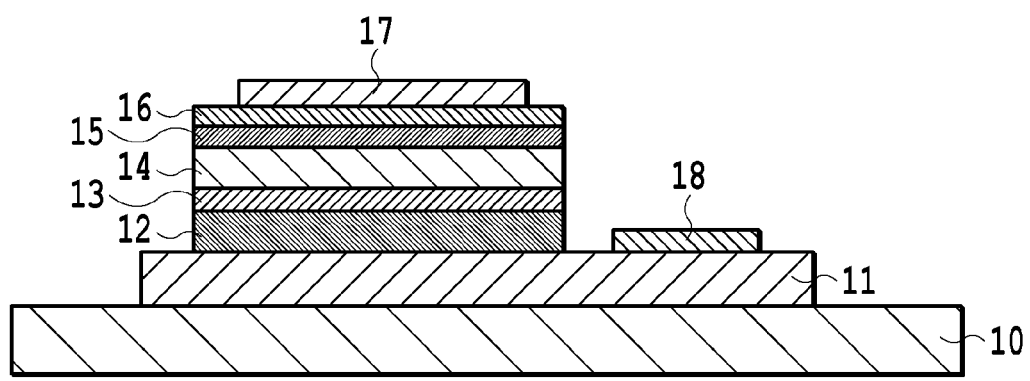
FIG. 1A illustrates photodiode of the first embodiment.
Figure 1B:
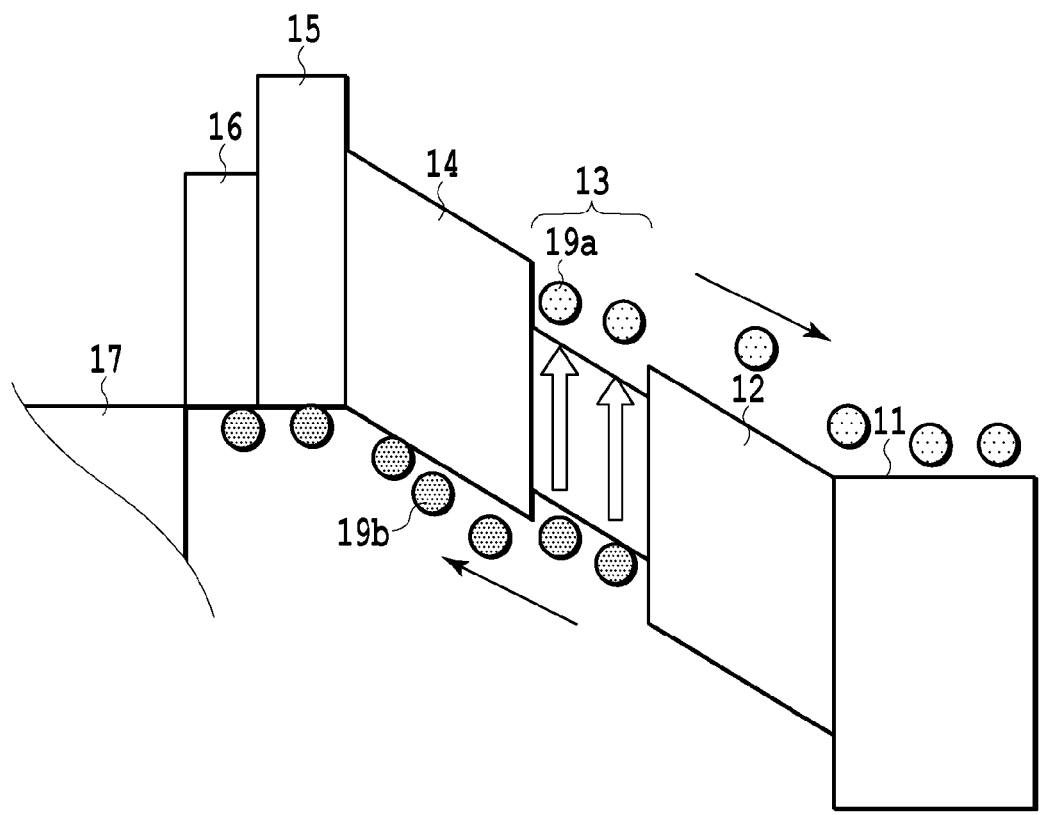
FIG. 1B illustrates the photodiode of the first embodiment.

The following section will describe in detail an embodiment of the present invention.
(First Embodiment)
FIGS. 1A and 1B illustrate the photodiode. FIG. 1A illustrates the layer configuration thereof. FIG. 1B illustrates the band diagram thereof.

As shown in FIG. 1A, in the photodiode of this embodiment, a semi-insulating InP substrate 10 has thereon a layered structure of an n-type contact layer 11 consisting of InP; a low-impurity concentration electron drift layer 12 consisting of InGaAsP (bandgap levy; a low-impurity concentration InGaAs light absorption layer 13; a low-impurity concentration hole drift layer 14 consisting of InAlGaAs (bandgap 1 eV); a p-type contact buffer layer 15 consisting of InP; and a p-type contact layer 16 consisting of InAlGaAs. The n-type contact layer 11 has thereon an n electrode 18. The p-type contact layer 16 has thereon a p electrode 17.

Within the active region of this photodiode, as shown in the band diagram of FIG. 1B, light absorption causes electrons 19a and holes 19b to occur, thus inducing the current due to the carrier travel.

The method of manufacturing the photodiode may be a method similar to the conventional one to manufacture an ultrahigh-speed photodiode. For example, the MO-VPE method is used to manufacture a substrate obtained by subjecting, on the semi-insulating InP substrate 10, a layered structure of the n-type contact layer 11 to the p-type contact layer 16 to epitaxial growth. The device processing is carried out by performing a chemical etching on the first mesa including layers from the InAlGaAs-p-type contact layer 16 to the InGaAsP-electron drift layer 12 and the second mesa of the InP-n contact layer 11. The device processing is performed by further forming the p electrode 17 and the n electrode 18 by metal vapor deposition to form the other required separation insulating film and metal wiring for example.

When the photodiode is applied a reverse bias voltage via the p electrode 17 and the n electrode 18, then the InGaAsP electron drift layer 12, the InGaAs light absorption layer 13, and the InAlGaAs hole drift layer 14 are depleted, thus inducing an electric field. When signal light enters in this status, electrons and holes are generated in the InGaAs light absorption layer 13 as described above. When these carriers travel through the depletion layer, induction current is generated in an external circuit. The hole drift layer 14 and the electron drift layer 12 have different material systems because the hole drift layer 14 and the electron drift layer 12 have small valance band discontinuity and small conduction band discontinuity to InGaAs, respectively, and thus the effect of a carrier trap effect due to a band discontinuity is reduced in a low electric field.

The above photodiode is mainly characterized in that, although this diode is based on a pin-type diode structure, the hole drift layer is inserted to the p-type contact layer side. A conventional pin-type diode is configured so that an electron drift layer is inserted to the n-type contact layer side, as has been already disclosed in Non-patent Publication 2. However, no disclosure is found according to which the hole drift layer is inserted to the p-type contact layer side. This is caused by the fact that the conventional pin-type diode has been required to provide a wide bandwidth and efficient device. Specifically, 3 dB bandwidth or output has been required and thus the hole drift layer not contributing to a wide bandwidth and efficient device has been considered as an unnecessary layer. In the case of the technique disclosed in Non-patent Publication 2, the electron speed is higher than that of the holes. Thus, an advantage is obtained according to which the 3 dB bandwidth can be expanded by increasing the 3 dB bandwidth or by reducing the junction capacitance.

On the contrary, the photodiode of this embodiment has a tendency according to which, when the hole drift layer is inserted to the p-type contact layer side, the contribution of the current component of holes having a slow speed is increased and the 3 dB bandwidth declines despite the intention. Specifically, with regard to the typical objective of improving the 3 dB bandwidth, the diode structure of the photodiode of this embodiment has no significance. However, under conditions having a fixed depletion layer thickness, it is clear that the transit time is reduced in proportion to the reduction of the average travel distance of the electrons generated in the InGaAs light absorption layer 13. Finally, the characteristic is that the frequency range of the electron current response is expanded and the response increases in the THz frequency region on the contrary.

In the above description of the embodiment, material lattice-matched to InP was selected and the hole drift layer was composed of InAlGaAs and the electron drift layer was composed of InGaAsP. However, the photodiode of this embodiment has basically no remarkable limitation by the material system and thus has a design concept that can be commonly applied.

(Second Embodiment)

Figure 2A:
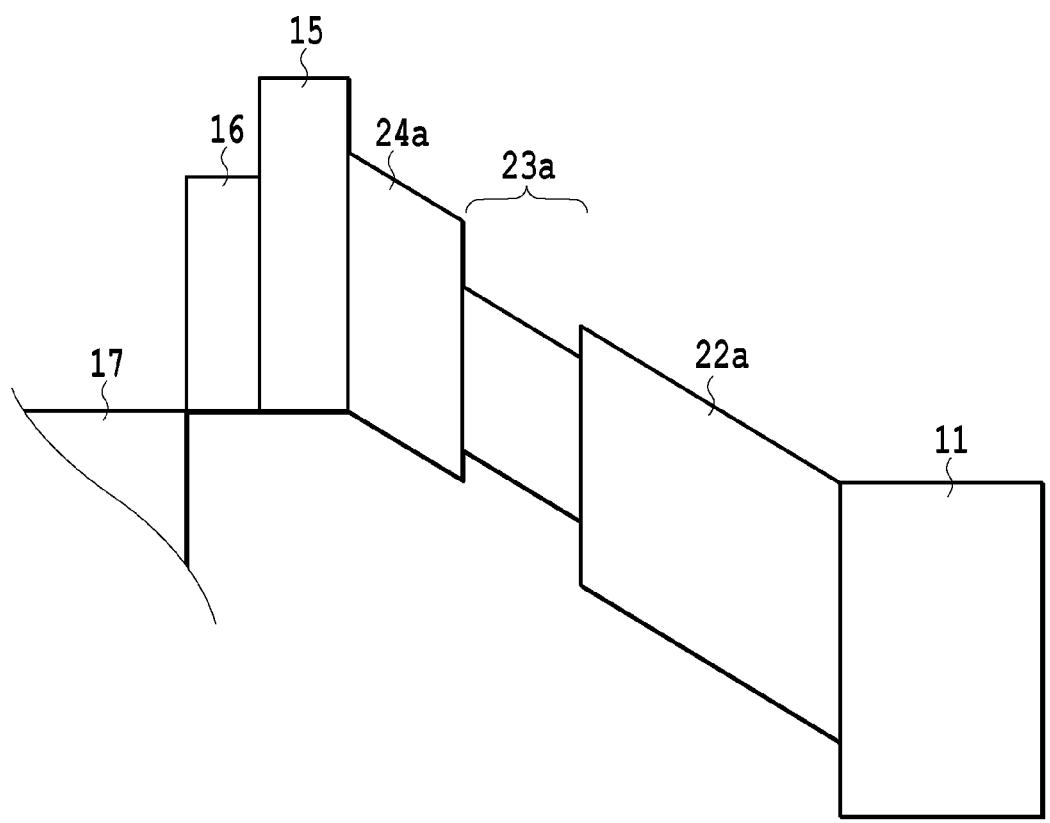
FIG. 2A illustrates the photodiode of the second embodiment.
Figure 2B:
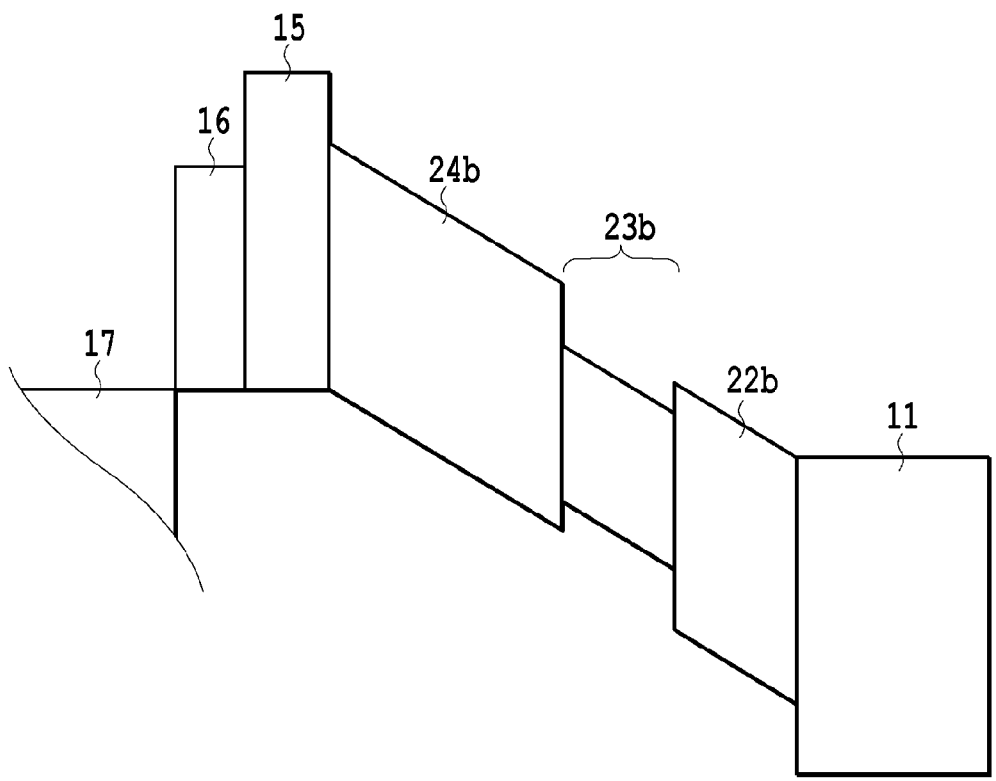
FIG. 2B illustrates the photodiode of the second embodiment.

The photodiode of this embodiment has the InInGaAs light absorption layer of which position in the depletion layer is changed from that of the photodiode of the first embodiment. FIGS. 2A and 2B illustrate the band diagram in the photodiode of the second embodiment. In the photodiode having the band diagram shown in FIG. 2A, the light absorption layer 23a is provided closer to the p-type contact layer 16 and the hole drift layer 24a has a thin thickness and the electron drift layer 22a has a thick thickness. On the contrary, in the photodiode having the band diagram shown in FIG. 2B, the light absorption layer 23b is provided closer to the n-type contact layer 11, the hole drift layer 24b has a thick thickness, and the electron drift layer 22b has a thin thickness. The other configurations are the same as those of the configuration shown in the first embodiment.

The photodiode of the present invention has a main feature that the hole drift layers 24a and 24b are inserted to the p-type contact layer 15 side (i.e., the positions of the light absorption layers 23a and 23b in the depletion layer are adjusted). The electron drift layers 22a and 22b as well as the hole drift layers 24a and 24b have a thickness adjusted according to the required light response characteristic. The configuration of FIG. 2A is not superior or inferior to the configuration of FIG. 2B. The photodiode of this embodiment may be set so as to maximize the response in a required frequency range by adjusting the position of the light absorption layer in the depletion layer. The following section will describe a difference in the response characteristic depending on the structure.

Figure 3A:
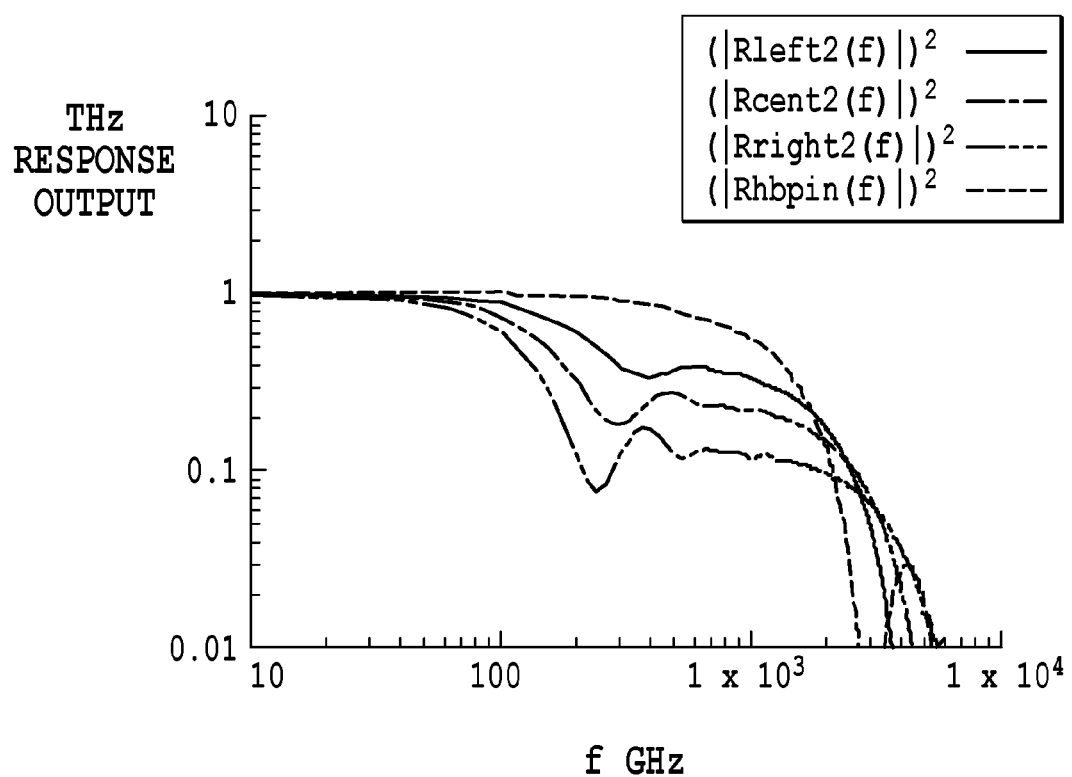
FIG. 3A illustrates the calculation result of the THz response output of the photodiode of the second embodiment.
Figure 3B:
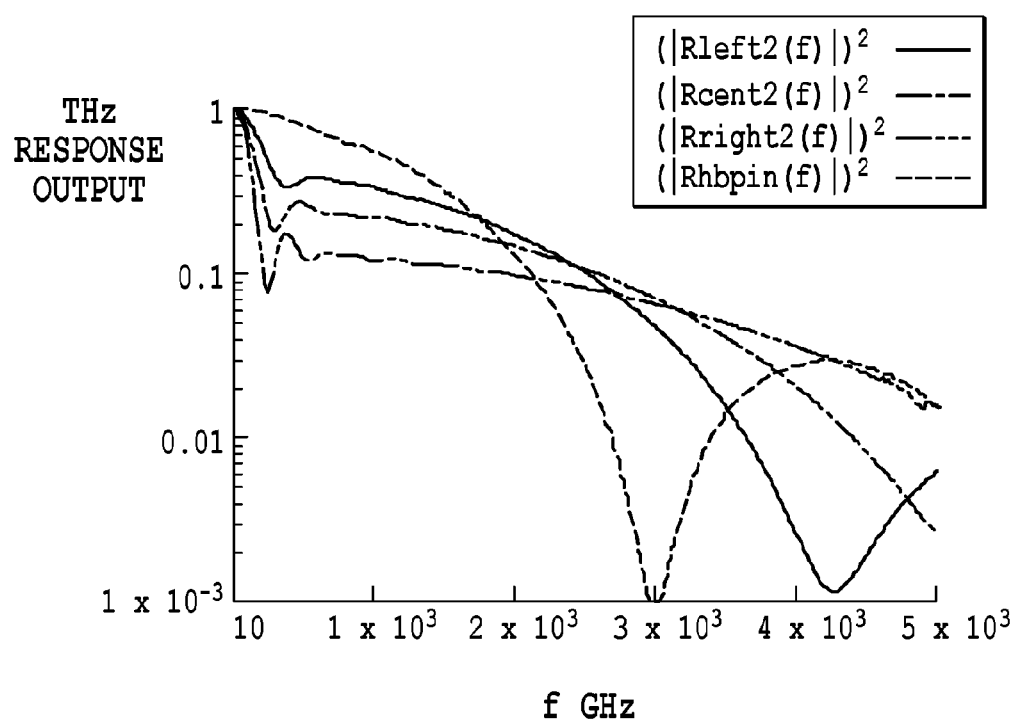
FIG. 3B illustrates the calculation result of the THz response output of the photodiode of the second embodiment.

The following section will compare the following four types of structures. Table 1 shows parameters. FIGS. 3A and 3B show the result of the calculation of the THz response output in the photodiode of this embodiment. FIG. 3A is a double logarithm graph illustrating the calculation result of the THz response output in a range from 10 GHz to $1 \times 10^4$ GHz. FIG. 3B is a single logarithm graph illustrating the calculation result of the THz response output in a range from 10 GHz to $5 \times 10^3$ GHz. In FIGS. 3A and 3B, for the comparison of (the logarithmic axis and the linear axis), such a structure is also included that has a hole drift layer having a thickness of zero based on the structure suggested in Non-patent Publication 2 (response 0). The curve at the response 0 is the same curve of $R06(f)$ of FIG. 8.

TABLE 1

Structure parameters for simulation of photodiode of the present invention

| | Hole drift layer thickness | Light absorption layer thickness | Electron travel layer thickness | Total depletion layer thickness | Curve in the drawing |
|---|---|---|---|---|---|
| Response 1 | 600 Å | 600 Å | 1100 Å | 2300 Å | Rleft2(f) |
| Response 2 | 900 Å | 600 Å | 800 Å | 2300 Å | Rcent2(f) |
| Response 3 | 1200 Å | 600 Å | 500 Å | 2300 Å | Rright2(f) |
| Response 0 | 0 Å | 600 Å | 1700 Å | 2300 Å | Rhbpin(f) |

Figure 8:
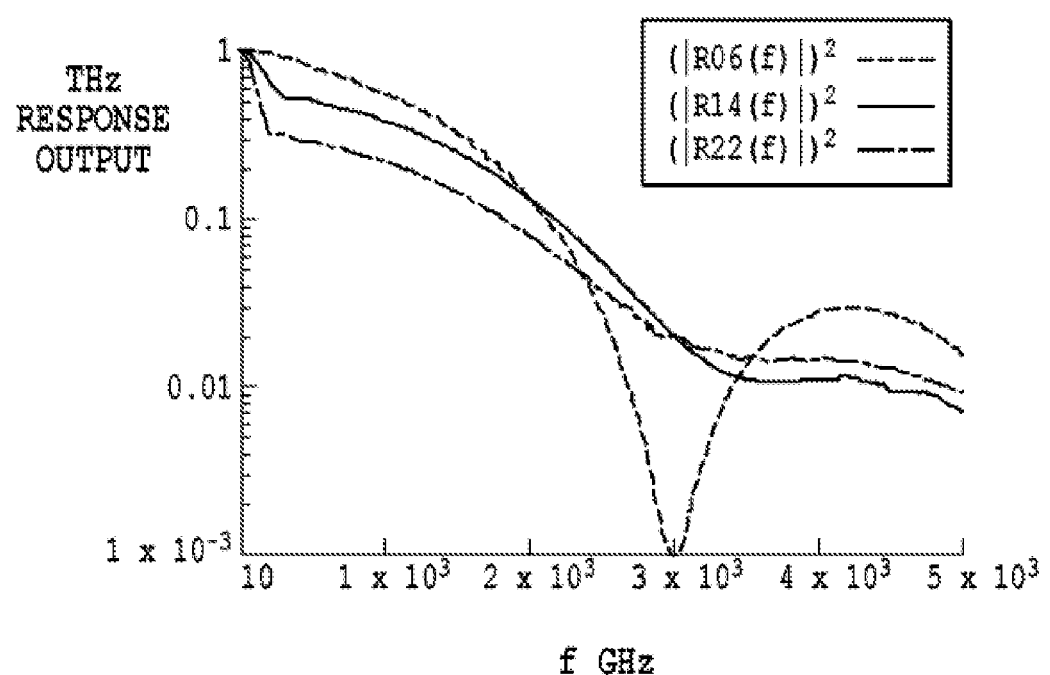
FIG. 8 illustrates the simulation result of the THz response output in a conventional photodiode module.

In the case of the conventional structure having no hole drift layer (curve of response 0), the 3 dB bandwidth is 1.1 THz (the same curve as $R06(f)$ of FIG. 8). The comparison shown in FIG. 3A clearly shows that an increase of the hole drift layer from 600 A through 900 A to 1200 A causes the 3 dB bandwidth to rapidly decline to about 120 GHz. On the other hand, according to FIG. 3B, the response in the THz region shows that an increase of the hole drift layer causes an increase of the skirt of the frequency response. When the operation frequency exceeds 2 THz, the conventional structure (response 0) shows a sharp decline of the response output in spite of the fact that the photodiode of this embodiment shows substantially no decline of the response output. Thus, it can be recognized that the photodiode of the present invention is superior to the conventional structure.

The response decline in the conventional structure is seen at 3 THz. On the other hand, this photodiode has a structure in which the response decline shifts to the high frequency side in accordance with the increase of the thickness of the hole drift layer. In particular, in the curve shown by the response 3 having the hole drift layer thickness of 1200 A, the response characteristic is relatively flat until 5 GHz is reached. It can be consequently recognized that the photodiode of this embodiment has a structure that can effectively provide the electron response in the THz frequency region by sacrificing the 3 dB bandwidth.

As described above, the photodiode of this embodiment has an effect similar to that of the photodiode of the first embodiment. Furthermore, the photodiode of this embodiment can be adjusted to provide a required output in a desired frequency range by changing the position of the light absorption layer in the depletion layer.

(Third Embodiment)

Figure 4:
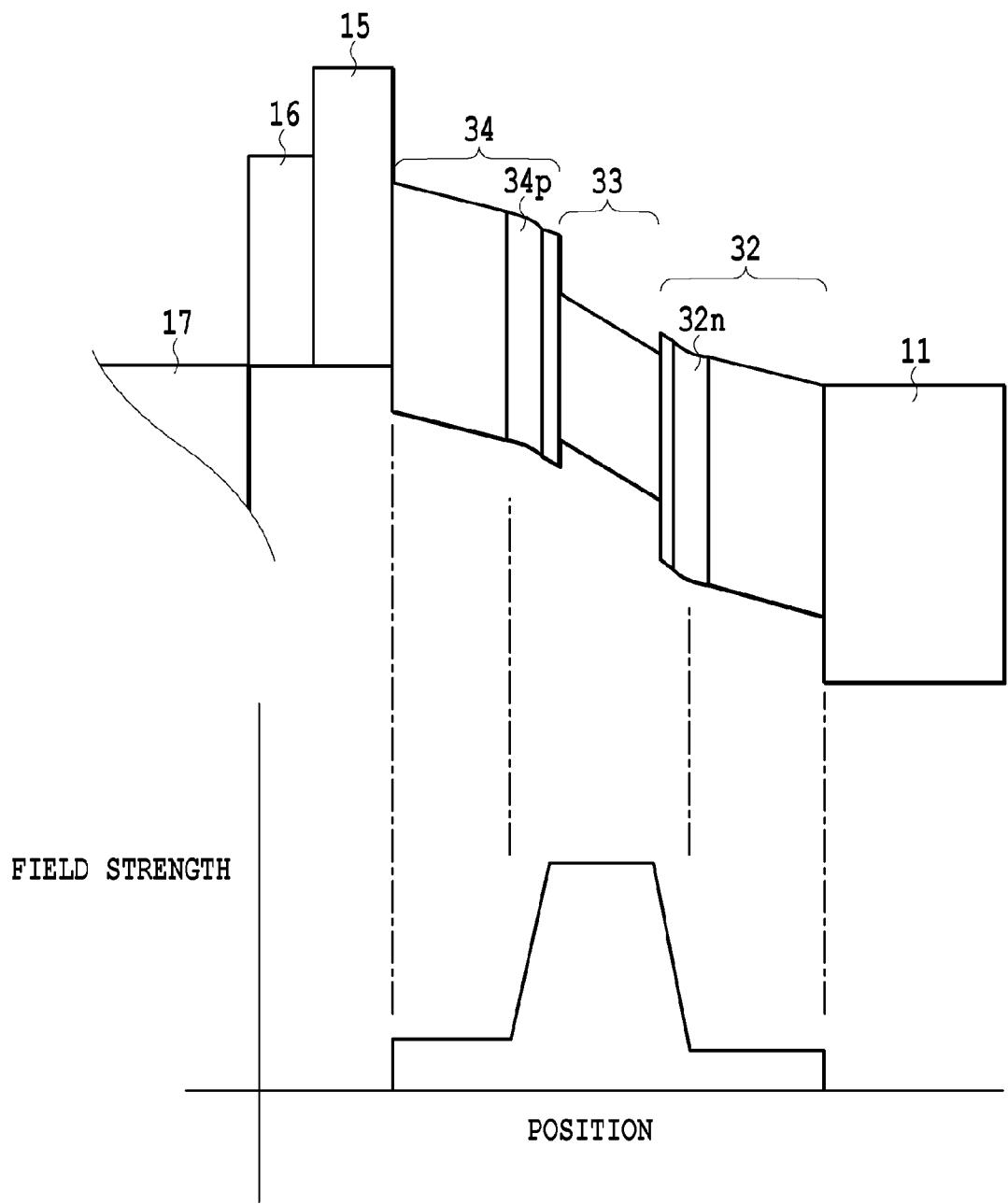
FIG. 4 illustrates the relation between the band diagram and the field strength with regard to the photodiode of the third embodiment.

The photodiode of this embodiment has a so-called step-type field strength profile in which, the field strength of the light absorption layer is higher than the field strengths of the electron drift layer and the hole drift layer of the photodiode of the first embodiment. FIG. 4 illustrates the relation between the band diagram of photodiode of the third embodiment and the field strength. As shown in FIG. 4, the photodiode of this embodiment includes an electron drift layer 32, an InGaA light absorption layer 33, and a hole drift layer 34 instead of the electron drift layer 12, the light absorption layer 13, and the hole drift layer 14 of the first embodiment. The electron drift layer 32 has an impurity concentration distribution consisting of InGaAsP (bandgap 1 eV). The InGaA light absorption layer 33 has a low-impurity concentration. The hole drift layer 34 has an impurity concentration distribution consisting of InAlGaAs (bandgap 1 eV). The electron drift layer 32 has an n-type doping layer 32n at the light absorption layer 33 side constituting a part thereof. The hole drift layer 34 has a p-type doping layer 34p at the light absorption layer 33 side constituting a part thereof. The ionized donor charge amount of the n-type doping layer 32n and the ionized acceptor charge amount of the p-type doping layer 34p are adjusted depending on a required difference in the field strength.

Since the n-type doping layer 32n and the p-type doping layer 34p have a narrow width, a step-like field strength profile as shown in FIG. 4 is obtained. Thus, the light absorption layer 33 has a field strength relatively higher than those of the electron drift layer 32 and the hole drift layer 34. When the light absorption layer 33 has a high field strength, electrons generated by light absorption can be accelerated within a shorter time to accelerate the response of the photodiode of this embodiment (i.e., the response of the THz region). The increase of the field strength of the light absorption layer 33 also has an action to suppress a change of the potential in the electron drift layer 32 to prevent the electron kinetic energy from being excessively high. Another structure also may be used in which a complicated structure is prevented by not inserting the p-type doping layer 34p and by inserting the n-type doping layer 32n only. When the hole drift layer 34 the electron drift layer 32 have a lower electric field, another advantage is obtained according to which a required bias voltage of the photodiode declines and thus the operation with high heat generation is possible.

As described above, the photodiode of this embodiment can provide not only an effect similar to that of the photodiode of the first embodiment but also provide an improved response speed by having a step-like field strength profile.

(Fourth Embodiment)

Figure 5:
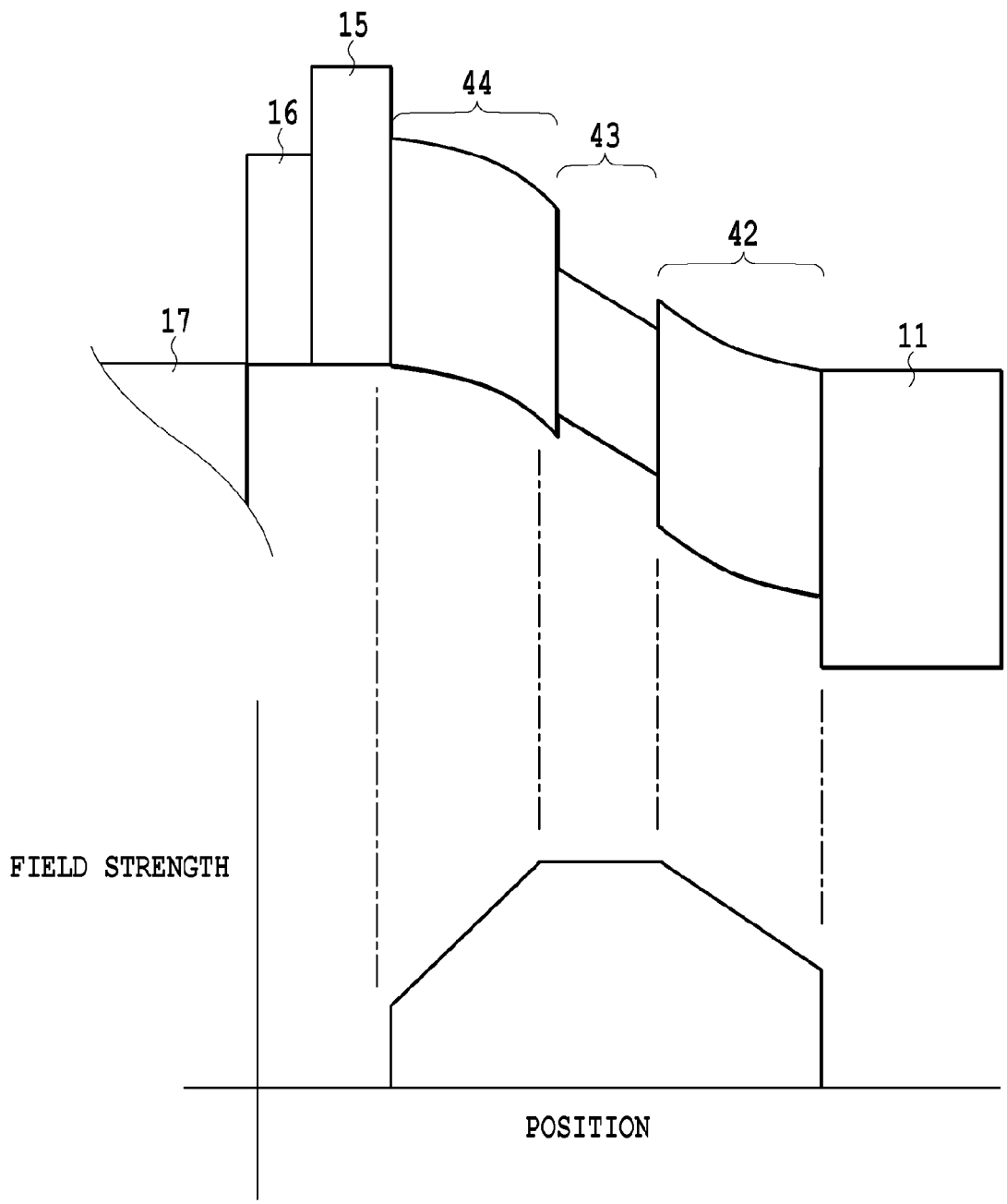
FIG. 5 illustrates the relation between the band diagram and the field strength with regard to the photodiode of the fourth embodiment.

The photodiode of this embodiment has been doped in electron drift layer and hole drift layer of the photodiode of the first embodiment. FIG. 5 shows the relation between the band diagram and the field strength of the photodiode of the fourth embodiment. As shown in FIG. 5, the photodiode of this embodiment includes an electron drift layer 42, an InGaA light absorption layer 43, and a hole drift layer 44 instead of the electron drift layer 12, the light absorption layer 13, and the hole drift layer 14 of the first embodiment. The electron drift layer 42 is composed of InGaAsP (bandgap 1 eV) and is subjected to n-type doping. The InGaA light absorption layer 43 has a low-impurity concentration. The hole drift layer 44 is composed of InAlGaAs (bandgap 1 ev) and is subjected to p-type doping.

The electron drift layer 42 and the hole drift layer 44 are subjected to n-type and p-type dopings, respectively. Thus, no light signal is inputted. As shown in FIG. 5, the electric field strength profile in which no electron or hole flows has a smooth trapezoidal shape. If a light signal is inputted, electrons travelling in the electron drift layer 42 and holes travelling in the hole drift layer 44 modulate the field strength distribution in the depletion layer 43 by the charge thereof. However, the present photodiode adjusts the n-type doping amount of the electron drift layer 42 and the p-type doping amount of the hole drift layer 44 so as to compensate the negative charge of the electrons during the operation and the positive charge of the holes.

The respective doping concentrations to be balanced with the carrier concentration are determined based on the operation current density. For example, when the operation at 5 mA current is performed in the junction area of 10 μm$^2$, the current density is $5 \times 10^4$ A/cm$^2$. The current density J is given by J=q×n×v based on the carrier concentration n, the carrier travel speed v, and the electron charge q. Thus, the electron charge density is calculated by J/(q×ve)=$5.2 \times 10^{15}$/cm$^3$. The hole charge density is calculated by J/(q×vlh)=$6.9 \times 10^{16}$/cm$^3$. In this manner, the n-type doping amount of the electron drift layer 42 and the p-type doping amount of the hole drift layer 44 are determined. In this manner, the structure is determined so that an appropriate electric field profile can be maintained at predetermined operation current. Thus, such a structure can be realized that has a good characteristic even at a higher photodiode operation current.

As described above, the photodiode of this embodiment can provide not only the same effect as that of the photodiode of the first embodiment but also an appropriate operation even at higher operation current.

(Fifth Embodiment)

Figure 6:
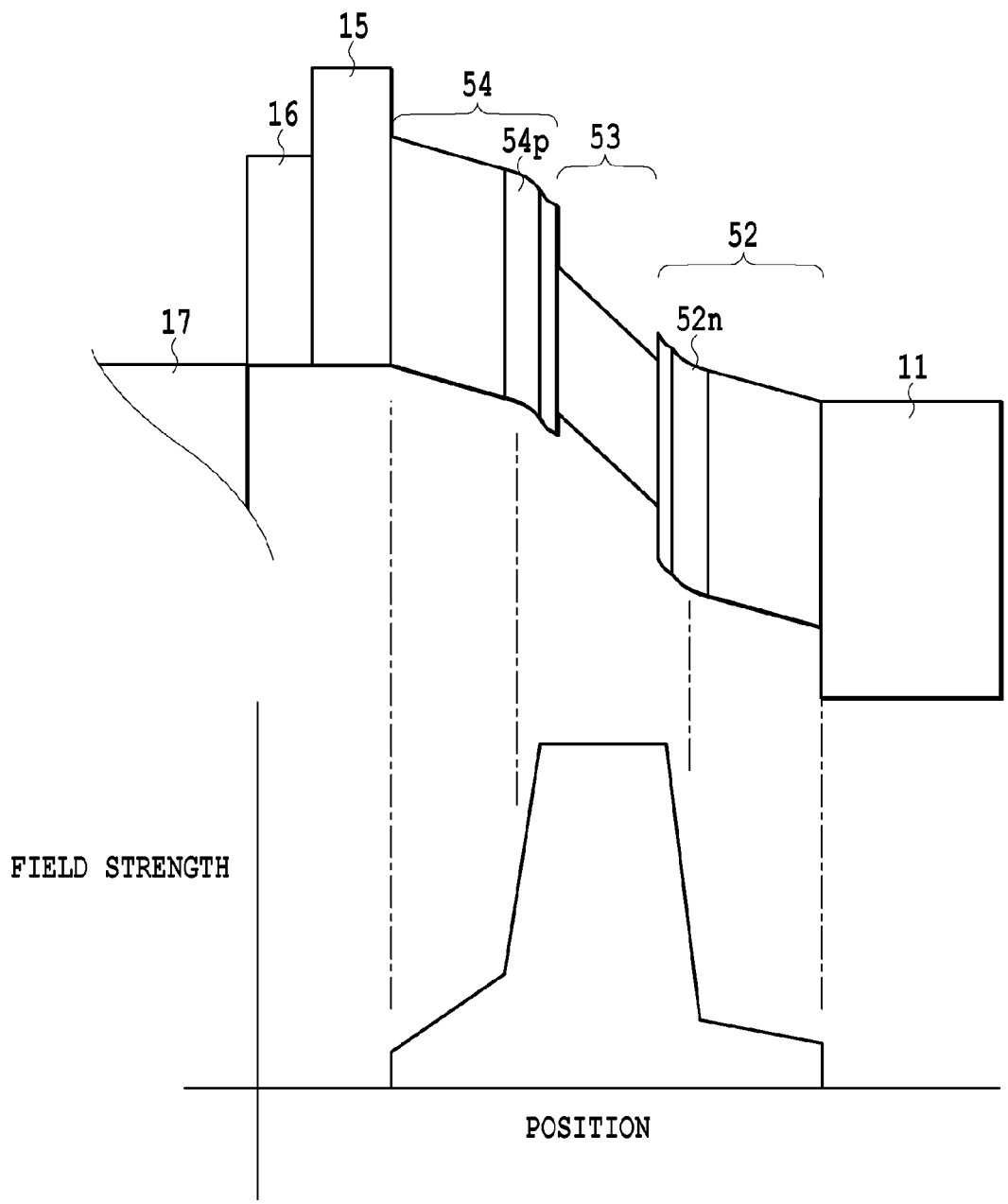
FIG. 6 illustrates the relation between the band diagram and the field strength with regard to the photodiode of the fifth embodiment.
Figure 7:
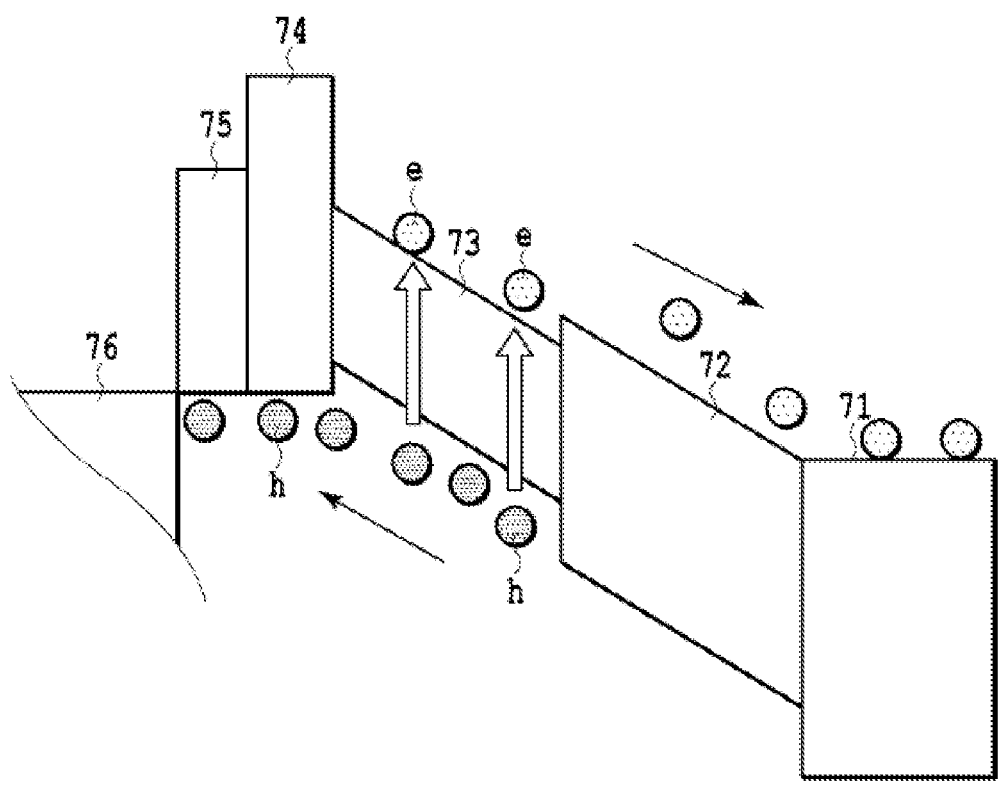
FIG. 7 illustrates the band diagram of a conventional photodiode module that can provide THz output.

The photodiode of this embodiment applys both of the step-like electric field profile shown in the third embodiment and the doping of the electron drift layer and the hole drift layer shown in the fourth embodiment. FIG. 6 shows the relation between the band diagram and the field strength of the photodiode of the fifth embodiment. As shown in FIG. 6, the photodiode of the fifth embodiment uses an electron drift layer 52, an InGaAs light absorption layer 53, and a hole drift layer 54 instead of the electron drift layer 12, the light absorption layer 13, and the hole drift layer 14 of the first embodiment. The electron drift layer 52 is composed of InGaAsP (bandgap 1 ev) and is subjected to n-type doping. The InGaAs light absorption layer 53 has a low-impurity concentration. The hole drift layer 54 is composed of InAlGaAs (bandgap 1 ev) and is subjected to p-type doping. Furthermore, the electron drift layer 52 has the n-type doping layer 52n having a higher concentration by the light absorption layer 53 constituting a part thereof. The hole drift layer 54 has the p-type doping layer 34p having a higher concentration at the light absorption layer 33 side constituting a part thereof.

The photodiode of this embodiment uses a combination of the two functions of the step-like electric field profile described in the third embodiment as well as the n-type doping to the electron drift layer and the p-type doping to the hole drift layer described in the fourth embodiment. The light absorption layer 53 has a field strength relatively higher than those of the electron drift layer 52 and the hole drift layer 54. Thus, electrons generated by light absorption can be accelerated within a shorter time to accelerate the current response and an appropriate operation can be performed even at operation current.

As described above, the photodiode of this embodiment can provide not only an effect similar to the photodiode of the first embodiment but also can accelerate the current response and can perform an appropriate operation even at high operation current.

Reference Signs List

| | | |
|---|---|---|
| 10 | Substrate | |
| 11 and 71 | N-type contact layer | |
| 12, 22a, 22b, 32, 42, 52, and 72 | | Electron drift layer |
| 13, 23a, 23b, 33, 43, 53, and 73 | | Light absorption layer |
| 14, 24a, 24b, 34, 44, and 54 | | Hole drift layer |
| 15 and 74 | P-type contact buffer layer | |
| 16 | P-type contact layer | |
| 11 | N-type contact layer | |
| 18 | N electrode | |
| 16 and 75 | P-type contact layer | |
| 17 and 76 | P electrode | |
| 19a and 19e | electron | |
| 19b and 19h | Hole | |

-continued

Reference Signs List

| | |
|---|---|
| 32n | N-type doping layer |
| 34p | P-type doping layer |

The invention claimed is:

1. A photodiode having a pin-type semiconductor structure, comprising:
a semiconductor layer structure obtained by sequentially layering an n-type contact layer, a low concentration layer, and a p-type contact layer; and an n electrode and a p electrode connected to the n-type contact layer and the p-type contact layer, respectively and, during the operation, the low concentration layer is depleted, wherein:
the low concentration layer is obtained by layering an electron drift layer, a light absorption layer, and a hole drift layer while being abutted to the n-type contact layer, the hole drift layer being formed so as to be thicker than the electron drift layer.

2. The photodiode according to claim 1, wherein the electron drift layer and the hole drift layer do not function as a light absorption layer, and the thickness of the electron drift layer and the thickness of the hole drift layer are changed to thereby adjust optical and response characteristic.

3. The photodiode according to claim 1, wherein a field strength of at least one of the electron drift layer and the hole drift layer is set to be relatively lower than that of the light absorption layer.

4. The photodiode according to claim 2, wherein the field strength of at least one of the electron drift layer and the hole drift layer is set to be relatively lower than that of the light absorption layer.

5. The photodiode according to claim 1, wherein the electron drift layer is subjected to n-type doping and the hole drift layer is subjected to p-type doping.

6. The photodiode according to claim 2, wherein the electron drift layer is subjected to n-type doping and the hole drift layer is subjected to p-type doping.

7. The photodiode according to claim 3, wherein the electron drift layer is subjected to n-type doping and the hole drift layer is subjected to p-type doping.

8. The photodiode according to claim 4, wherein the electron drift layer is subjected to n-type doping and the hole drift layer is subjected to p-type doping.

\* \* \* \* \*